(12) United States Patent
Neron et al.

(10) Patent No.: US 7,724,792 B2
(45) Date of Patent: May 25, 2010

(54) DRIVING LASER DIODES WITH IMMUNITY TO TEMPERATURE CHANGES, AGING, AND OTHER EFFECTS

(75) Inventors: Christophe Neron, Le Rouret (FR);
Cristiano Bazzani, Irvine, CA (US);
Dario Soltesz, Irvine, CA (US);
Ramakrishna Shivaram, Torrance, CA (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 0 days.

(21) Appl. No.: 11/367,726

(22) Filed: Mar. 3, 2006

(65) Prior Publication Data
US 2008/0291956 A1    Nov. 27, 2008

(51) Int. Cl.
*H01S 3/00*    (2006.01)
(52) U.S. Cl. .............. 372/38.02; 372/38.01; 372/38.07
(58) Field of Classification Search .............. 372/38.01, 372/38.02, 38.03, 38.07, 38.09, 29.015
See application file for complete search history.

(56) References Cited

U.S. PATENT DOCUMENTS

| | | | | |
|---|---|---|---|---|
| 3,832,640 | A * | 8/1974 | Cederquist et al. ............. | 377/47 |
| 4,558,465 | A * | 12/1985 | Siegel et al. ................ | 398/195 |
| 4,584,720 | A * | 4/1986 | Garrett ........................ | 398/191 |
| 4,592,057 | A * | 5/1986 | Comerford ..................... | 372/8 |
| 4,709,416 | A * | 11/1987 | Patterson ..................... | 398/197 |
| 4,718,118 | A * | 1/1988 | Viola .......................... | 398/197 |
| 4,745,609 | A * | 5/1988 | Yoshikawa ................ | 372/29.02 |
| 4,862,289 | A * | 8/1989 | Shimada ...................... | 347/247 |
| 4,865,011 | A * | 9/1989 | Stancliffe et al. ............. | 126/77 |
| 4,899,348 | A * | 2/1990 | Kiya et al. ................ | 372/29.01 |
| 4,907,236 | A * | 3/1990 | Shimada ....................... | 372/31 |
| 5,757,013 | A | 5/1998 | Groger et al. | |
| 6,137,429 | A * | 10/2000 | Chan et al. ................... | 341/143 |
| 6,188,498 | B1 * | 2/2001 | Link et al. ................... | 398/195 |
| 6,466,595 | B2 | 10/2002 | Asano | |
| 6,609,842 | B1 | 8/2003 | Kimbrough | |
| 2002/0114365 | A1 * | 8/2002 | Gilliland et al. .......... | 372/38.02 |
| 2003/0058146 | A1 * | 3/2003 | Sundquist et al. ........... | 341/143 |
| 2003/0128725 | A1 * | 7/2003 | Roddy et al. .................. | 372/32 |
| 2003/0174744 | A1 | 9/2003 | Reilly | |
| 2004/0243899 | A1 * | 12/2004 | Bonneau et al. ............. | 714/733 |

OTHER PUBLICATIONS

Sackinger, Eduard et al., A 15-mW, 155-Mb/s CMOS Burst-Mode Laser Driver with Automatic Power Control and End-of-Life Detection, IEEE Journal of Solid-State Circuits, vol. 34, No. 12, pp. 1944-1950, Dec. 1999.
International Search Report and Written Opinion.

* cited by examiner

*Primary Examiner*—Minsun Harvey
*Assistant Examiner*—Joshua King
(74) *Attorney, Agent, or Firm*—Thomas, Kayden, Horstemeyer & Risley, LLP

(57) ABSTRACT

Various systems and methods are provided to achieve laser power control. In one embodiment, a system is provided that comprises a counter that holds a digital value. An digital-to-analog converter is employed to convert the digital value to an analog current. A data threshold current is generated by a laser driver based upon the analog current. The data threshold current is employed to represent a data value in a data signal employed to drive a laser diode. Also, circuitry is employed to adjust the digital value based upon a comparison between a target threshold current and a feedback current generated from a laser output of the laser diode.

18 Claims, 14 Drawing Sheets

DRIVING LASER DIODES WITH IMMUNITY TO TEMPERATURE CHANGES, AGING, AND OTHER EFFECTS

BACKGROUND

Laser diodes are advantageously employed in digital optical data communications applications as they have relatively high bandwidth resulting in high data rates. In order to control a laser diode, a modulation reference current and a bias current are applied to a laser driver. The laser driver generates a data signal that drives a laser diode based upon the modulation reference current and the bias current. Typically, the bias current is that which is necessary to maintain a constant "0" power level in the laser diode. The modulation reference current is that which is necessary to maintain a constant "1" power level in the laser diode. In order to transmit data, the laser bias current and the modulation reference current are employed to cause the laser to transmit data using a constant "0" power level and a constant extinction ratio, which is the ratio between the "1" power level and the "0" power level. Unfortunately, the transmission power levels of a laser diode may vary in an undesirable manner over time with changing temperature, age of the laser diode, and due to other factors. As a result, data communication may be hampered over time using laser diodes. Also, the ratio of the power of a logical "1" to a logical "0" degrades over time, thereby reducing receiver margin and possibly increasing bit error rates.

BRIEF DESCRIPTION OF THE SEVERAL VIEWS OF THE DRAWINGS

The invention can be understood with reference to the following drawings. The components in the drawings are not necessarily to scale. Also, in the drawings, like reference numerals designate corresponding parts throughout the several views.

DETAILED DESCRIPTION

Figure 1:
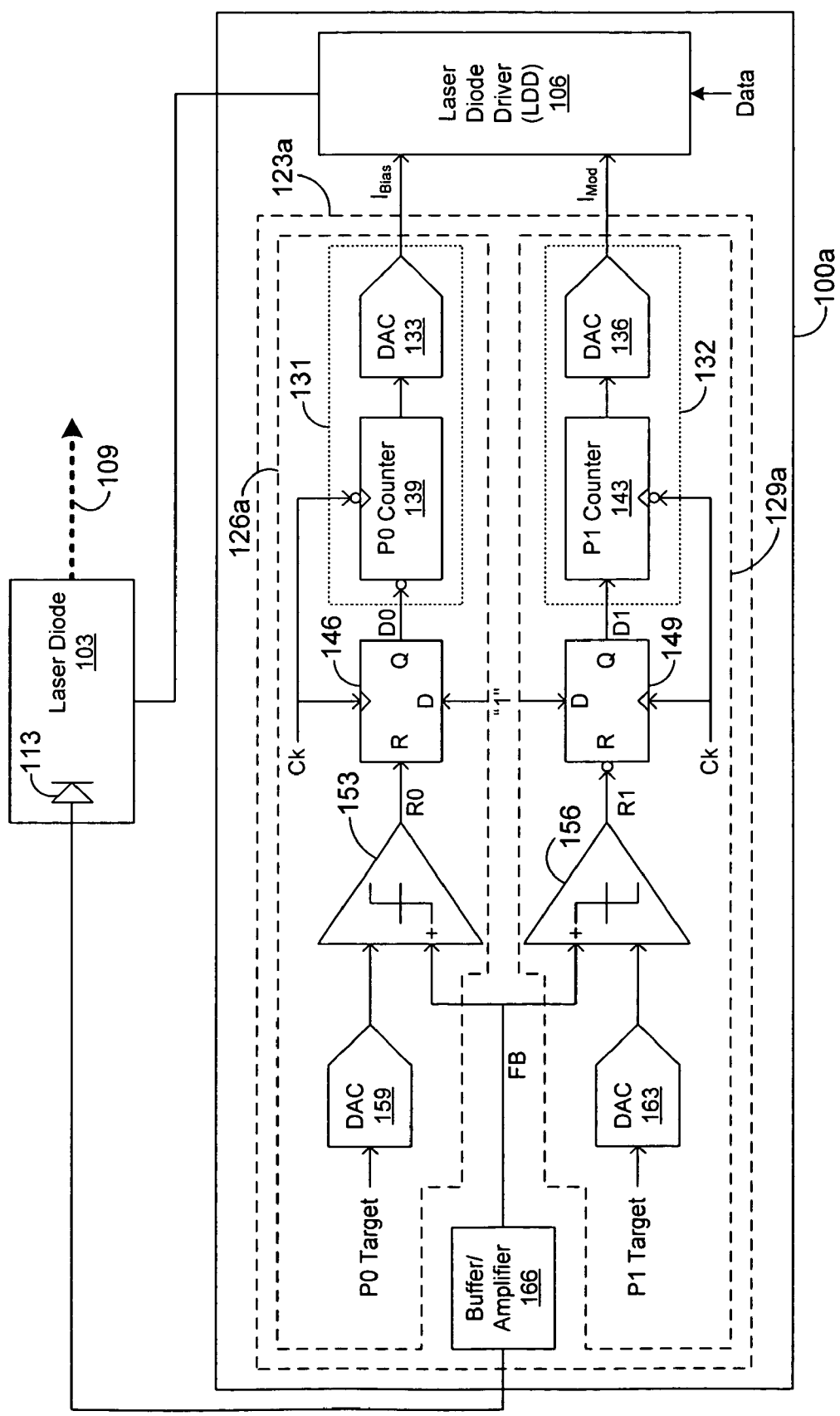
FIG. 1 is a schematic that provides one example of a laser power control circuit according to an embodiment of the present invention.

With reference to FIG. 1, shown is a schematic of a laser driver circuit 100a that is coupled to a laser diode 103 according to an embodiment of the present invention. The laser driver circuit 100a includes a laser diode driver (LDD) 106 that generates a laser driver current. The laser driver current embodies a data signal that is applied to the laser diode 103. The laser diode driver 106 generates the laser driver signal based upon a data input. In response to the signal, the laser diode 103 generates laser radiation 109. A portion of the laser radiation 109 is directed to a laser photodetector 113. The laser photodetector generates a feedback signal that is proportional to the laser radiation 109 generated by the laser diode 103. The feedback signal is applied to the laser driver circuit 100a as will be described.

The laser radiation 109 generated by the laser 109 may comprise, for example, a laser beam of a predefined wavelength that is employed, for example, in data communications applications in which data is transmitted through optical fiber cables as can be appreciated. Also, the laser diode 103 may be employed in other contexts for other applications as can be appreciated. Regardless of the application for which the laser diode 103 is employed, the output radiation 109 of the laser diode 103 must often comply with given specifications for which the application of the laser diode 103 is used. For example, where the laser diode 103 is employed to communicate digital data, then the output radiation 109 may toggle between a maximum radiation output that represents a logical "1" and a minimum or zero radiation output that represents a logical "0". The power generated by the laser diode 103 under these circumstances to represent a logical "0", for example, may be specified by a communications standard. Consequently, in this situation it may be important that the power output of the laser diode 103 be controlled to meet the requirements of the standard.

In order to generate the laser output 109 that toggles between the maximum laser output representing a logical "1" and the minimum laser output representing a logical "0" (which may be a laser output of "0"), the laser driver signal applied to the laser diode 103 toggles between corresponding maximum and minimum currents generated by the laser diode driver 106. The maximum and minimum currents are generated by the laser diode driver 106 based upon a bias current $I_{BIAS}$ and a modulation current $I_{MOD}$ that are applied to the laser diode driver 106. In this respect, the maximum current is generated by the laser diode driver 106, for example, based upon a summation of the bias current $I_{BIAS}$ and the modulation current $I_{MOD}$. The minimum current is generated by the laser diode driver 106, for example, based upon the bias current $I_{BIAS}$. In generating the maximum and minimum currents that are applied to the laser diode 103, the laser diode driver 106 may amplify the bias current $I_{BIAS}$ and the modulation current $I_{MOD}$ or may condition these currents in some other manner.

The minimum current applied to the laser diode 103 is generally a minimum current necessary to ensure that the laser diode 103 is maintained in an operational state. In this respect, when the minimum current generated based upon the bias current $I_{BIAS}$ is applied, the laser diode 103 operates just on the threshold of generating the laser radiation 109 or may actually be generating a low level of the laser radiation 109. In one embodiment, the minimum current applied to the laser diode 103 is proportional to the bias current $I_{BIAS}$.

Also, the modulation current $I_{MOD}$ applied to the laser diode 103 is that which causes the laser diode 103 to generate laser radiation 109 at a predefined power level as required by a relevant communication standard or other specification. The laser diode driver 106 receives bias current $I_{BIAS}$ and modulation current $I_{MOD}$ from a dual-loop power control circuit 123a according to an embodiment of the present invention as will be described in the detail to follow.

In one embodiment, the laser diode 103 is driven by at least the minimum current generated based on the bias current $I_{BIAS}$ so as to remain in the operational state as described above. If the minimum input signal is lost, then the laser diode 103 may transition into a non-operational state and would have to be restarted. In the event that this would occur, then the laser diode 103 would be non-operational for a small period of time after the application of the minimum current after the drop off, typically measured in nanoseconds, before laser diode 103 would be in a state in which it was capable of transmitting data. Where the laser diode 103 is employed for high-speed data communications purposes, such a delay may be very costly and result in non-optimal transmission which could lead to a loss of a significant amount of data. Also, the bias current $I_{BIAS}$ and the modulation current $I_{MOD}$ may over time, or the laser output of the laser diode 103 may vary with respect to the magnitude of the laser driver current. Consequently, it is important to maintain proper thresholds of laser current applied to the laser diode 103 for proper continuous operation.

To accomplish this, the dual-loop power control circuit 123a generates the bias current $I_{BIAS}$ and modulation current $I_{MOD}$ that are applied to the laser diode driver 106 that generates the ultimate current that is applied to the laser diode 103. In order to generate the bias current $I_{BIAS}$ and modulation current $I_{MOD}$, the dual loop power control circuit 123a includes two power control loop circuits 126a and 129a. The power control loop circuit 126a includes a current generation circuit 131 that generates the bias current $I_{BIAS}$. The power control loop circuit 129a also includes a current generation circuit 132 that generates the modulation current $I_{MOD}$. The power control loop circuits 126a and 129a ensure that the magnitudes of the bias current $I_{BIAS}$ and the modulation current $I_{MOD}$ are maintained an optimal levels as will be discussed.

In one embodiment, the current generation circuit 131 includes a digital-to-analog converter 133 that is coupled to the laser diode driver 106. Similarly, the current generation circuit 132 includes a digital-to-analog converter 136 that is coupled to the laser diode driver 106. Also, the current generation circuit 131 includes a P0 counter 139 and the current generation circuit 132 includes P1 counter 143. The designations "P0" and "P1" refer to the fact that these counters 139 and 143 control the magnitude of the bias current $I_{BIAS}$ and the modulation current $I_{MOD}$ that are employed to generate the laser power representing a logical "0" or a logical "1". The outputs of the counters 139 and 143 are applied to the respective digital-to-analog converters 133 and 136.

The power control loop circuits 126a and 129a also include D flip-flops 146 and 149. The D flip-flop 146 of the power control loop circuit 126a generates a signal output D0 that is applied to an inverting input of the P0 counter 139. In a similar manner, an output signal D1 is generated by the D flip-flop 149 of the power control loop circuit 129a is applied to an input of the P1 counter 143 as shown. Both of the D flip-flops 146 and 149 include an input D into which a logical "1" is applied. In this respect, a voltage is applied to the inputs D of the D flip-flops 146 and 149 that represents a logical "1" as can be appreciated.

In addition, in one embodiment the current generation circuits 131 and 132 as described above are implemented as a digital circuit comprising the counters 139/143 and the digital-to-analog converters 133/136. Alternatively, in another embodiment, the current generation circuits 131 and 132 may be implemented as analog circuits, for example, in which the output of the D flip-flops 146 and 149 may be sent to a loop filter (such as an RC filter or integrator) and the analog signal output therefrom creates the bias and modulation currents $I_{BIAS}$ and $I_{MOD}$ through a voltage to current conversion of a simple scaling circuit as can be appreciated.

Each of the power control loop circuits 126a and 129a includes a comparator 153 and 156, respectively. The comparator 153 generates signal output R0 that is applied to a reset input R of the D flip-flop 146. Similarly, the comparator 156 generates a signal output R1 that is inverted and applied to the reset input of the D flip-flop 149. The comparators 153 and 156 are analog devices that compare two analog input voltages and generate the signal outputs R0 or R1, respectively. Specifically, the signal outputs R0 and R1 are digital outputs that are generated based upon the comparison made between two analog inputs to the respective comparators 153 or 156. The signal outputs R0 or R1 comprise voltages that represent a logical "0" or a logical "1" depending upon the results of the comparison.

In one embodiment, the power loop control circuit 126a includes a digital-to-analog converter 159 that generates an analog current that is applied as an input to the comparator 153. The current generated by the digital-to-analog converter 159 is proportional to a zero threshold target denoted herein as "P0 target". This value establishes a digital threshold that is proportional to the desired bias current $I_{BIAS}$ that is to be applied to the laser diode driver 106 to generate a corresponding minimum current applied to the laser diode 103.

Similarly, in one embodiment the power control loop circuit 129a also includes a digital-to-analog converter 163 that generates an analog current output that is applied as an input to the comparator 156. In this respect, the digital-to-analog converter 163 receives a digital input that comprises a digital threshold that is proportional to the maximum current applied to the laser diode 103 in generating the laser radiation 109. The digital threshold applied to the digital-to-analog converter 163 is denoted herein as "P1 target" which is the monitor photodetector current corresponding to the laser power necessary to generate a logical "1". Similarly, the terminology "P0 target" is the monitor photodetector current corresponding to the laser power that generates a logical "0". Alternatively, when implemented in the current domain, other components may be employed beyond the digital-to-analog converters 159 and 163 to establish the P0 and P1 targets. In this respect, the P0 and P1 targets can be currents or voltages depending on the comparator used, and a digital-to-analog converter may be used in the case the P0 and P1 targets are expressed in the form of digital bits.

Each of the comparators 153 and 156 also receive a feedback input from the laser photodiode 113. In particular, the signal generated by the laser photodiode 113 is applied to a buffer/amplifier 166. The output of the buffer/amplifier 166 is applied to respective inputs of the comparators 153 and 156. The outputs of R0 and R1 of the comparators 153 and 156 are equal to a logical "1" when the feedback signal applied to the comparators 153 is greater than the respective analog signals generated by the digital-to-analog converters 156 and 159 based upon the P0 target and P1 target inputs. Alternatively, the output based on the comparisons performed by the comparators 153 may differ in an implementation in the current domain, etc.

In addition, a clock signal Ck is applied to a clock input of each of the D flip-flops 146 and 149. In this respect, the D flip-flops are clock components, although it is possible that other components that perform the same function as the D flip-flops may be used. The clock signal Ck is also applied to inverting clock inputs of the counters 139 and 143. According to one embodiment, the clock signal includes a maximum frequency that is at least one half the minimum frequency of the data signal. In this respect, the time period of a 50% duty cycle of the clock signal is greater than a time duration of a maximum number of multiple consecutive digits of equal value that is allowed to be transmitted by the laser diode. Stated another way, the minimum time period between the upward and downward transitions of the clock signal is greater than the time it takes for the maximum number of multiple consecutive digits to be transmitted. The maximum number of multiple consecutive digits may be specified, for example, by an applicable standard that dictates the requirements of the data communication for which the laser diode 103 is employed. This time period ensures that the values D0 and D1 output by the D flip-flops are not affected by toggling that may occur due to the data signal straddling either the P0 or P1 targets as will be described. The clock signal Ck may be any signal that conforms with the above requirements and may be generated using a local oscillator, or other reference clock if available. In this respect, the clock signal Ck may be a divided down version of some other clock signal or a divided down version of the data signal, etc.

Next, the general operation of the laser driver circuit 100a is described. In particular, the operation of the power control loop circuits 126a and 129a is described in generating the bias current $I_{BIAS}$ and the modulation current $I_{MOD}$. To begin, each of the counters 139 and 143 holds a digital value. It is this digital value that is applied as an output to the digital-to-analog converters 133 and 136 that, in turn, generate the bias current $I_{BIAS}$ and the modulation current $I_{MOD}$ that are applied to the laser diode driver 106 depending on the data input. The digital values held by the counters 139 and 143 may be incremented or decremented depending upon the inputs received from the respective D flip-flops 146 and 149. Alternatively, in an analog setup, the bias current $I_{BIAS}$ and the modulation current $I_{MOD}$ may be maintained and adjusted without maintaining the digital value, for example, by using a holding capacitor that maintains a voltage that can be adjusted using an analog filter. In the case of the digital counters, if a logical "0" is seen at the input of a given one of the counters 139 or 143 at the occurrence of a respective transition of the clock Ck, then the digital value stored therein is decremented. Similarly, if the a logical "1" is seen at the input of a given one of the counters 139 or 143 at the occurrence of the respective transition of the clock Ck, then the digital value stored therein is incremented.

Thus, the bias current $I_{BIAS}$ and modulation current $I_{MOD}$ applied to the laser diode driver 106 will vary based upon variation in the respective digital values held in the counters 139 and 143. Depending upon the resolution of the counters 139 and 143, which may correspondingly depend upon the number of binary digits applied to the digital-to-analog converters 133 and 136, a single increment or decrement of the digital values in the counters 139 and 143 will cause a corresponding greater or lesser change in the bias current $I_{BIAS}$ or modulation current $I_{MOD}$.

The laser diode driver 106 generates a laser driver signal that embodies the data received as an input. The laser driver signal is a digital signal that is generated based upon the bias current $I_{BIAS}$ and the modulation current $I_{MOD}$. Each of the power control loop circuits 126a and 129a cause the digital values in the counters 139 and 143 to be adjusted based upon the comparison between the respective target threshold currents generated based on the digital values of P0 target or P1 target and the feedback current generated from the laser photodiode 113 of the laser diode 103. The digital values held in the counters 139 and 143 are adjusted based upon the outputs P0 and P1 of the D flip-flops 146 and 149. In this respect, the clock signal Ck triggers the adjustment of the digital values in the counters 139 and 143. Due to the fact that the maximum frequency of the clock signal Ck is less than or equal to one half of the minimum frequency of the data signal, the values for D0 and D1 applied to the counters 139 and 143 are reliable and cause a desired change in the digital values contained therein to ensure that the output of the laser diode driver 106 transitions between desired minimum and maximum levels.

Ultimately, in the power control loop circuit 126a, for example, when the feedback signal from the laser photodiode 113 is greater than the analog signal generated by the digital-to-analog converter 159 due to the P0 target value applied thereto, then the output R0 of the comparator 153 will comprise a logical "1". As a consequence, the D flip-flop 146 is reset and the output D0 is equal to a logical "0". Given that the output of the D flip-flop 146 is inverted as it is applied as an input to the P0 counter 139, then a logical "1" is applied to the P0 counter 139 and the digital value stored therein is incremented upon a downward transition in the clock signal Ck. The opposite occurs when the output R0 of the comparator 153 is a logical "0" based upon the comparison performed.

The power control loop circuit 129a operates in a similar manner with the exception that the signal output R1 is inverted as it is applied to the D flip-flop 149, the output D1 of the D flip-flop is not inverted as it is applied as an input to the P1 counter 143, and the digital value stored in the P1 counter 143 is either incremented or decremented upon an upward transition in the clock signal Ck.

In addition, while the laser driver circuit 100a is described in the voltage domain, it is understood that the same circuit may be implemented in the current domain. In this respect, the feedback may comprise a current that is applied to a current mirror, for example, to generate two feedback currents that are applied to each of the comparators 153 and 156 as can be appreciated.

Figure 2A:
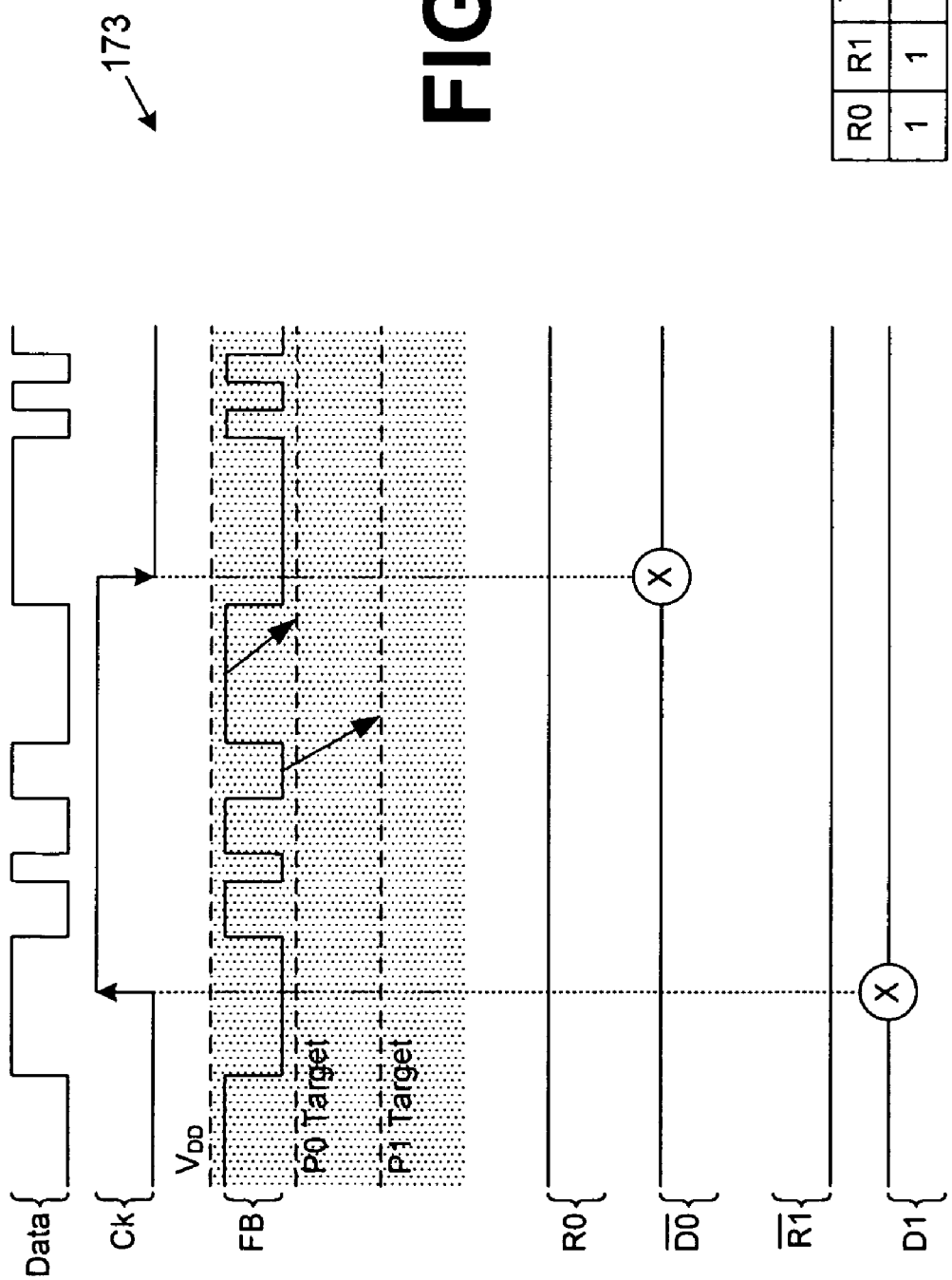
FIGS. 2A-2F are timing diagrams that provide examples of various scenarios of operation of the laser power control circuit of FIG. 1 according to various embodiments of the present invention.

Referring next to FIG. 2A, shown is a timing diagram 173 that illustrates the operation of the dual-loop power control circuit 123a according to an embodiment of the present invention. As shown, in one embodiment the feedback signal (FB) generated by the buffer/amplifier 166 (FIG. 1) has the opposite polarity of the feedback current generated by the photodiode 113 (FIG. 1), hence the feedback signal FB is an inverted version of the data signal as seen in the timing diagram 173. It may be the case that the feedback signal FB is delayed with respect to the data signal by predefined period of time. The feedback signal FB in the timing diagram 173 is greater than both the target thresholds P0 target and P1 target, but is less than a maximum power voltage $V_{DD}$. According to one embodiment, it is desirable that the feedback signal FB fall between P1 target and P0 target such that the upper and lower extremities of the feedback signal FB were approximately equal to P0 target and P1 target. In other embodiments, it may be desirable that the feedback signal FB operate with magnitudes relating to other thresholds as can be appreciated.

As shown in the timing diagram 173, the bias current $I_{BIAS}$ (FIG. 1) and modulation current $I_{MOD}$ (FIG. 1) need to be adjusted so that the feedback signal FB falls in the appropriate position and operates with a desired extinction ratio which refers to the difference between the maximum laser output and the minimum laser output.

The upward and downward transitions of the clock signal Ck cause the acquisition of the outputs of the D flip-flops 146 and 149, which comprise the inverted output D0 and the output D1, into the counters 139 and 143. As shown, the inverted output D0 is a logical "1" and the output D1 is also a logical "1". The states of the outputs R0 and R1 of the comparators 153 and 156 (FIG. 1) as well as the outputs D0 and D1 of the flip-flops 146 (FIG. 1) and 149 (FIG. 1) are shown in the truth table that is shown in the lower right hand corner of the timing diagram 173. In this respect, the truth table coincides with the scenario described in the timing diagram 250. For the sake of convenience, each timing diagram described herein also includes a corresponding truth table in the lower right hand corner.

Figure 2B:
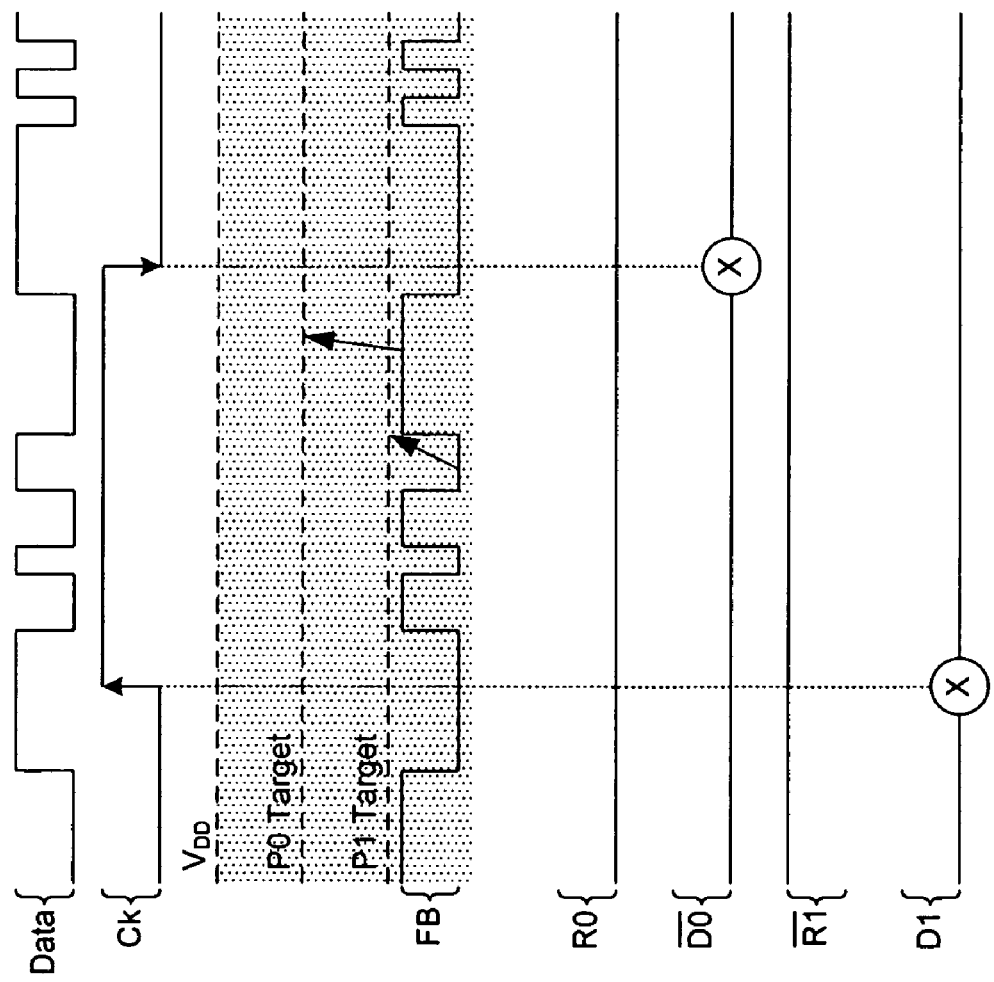

With reference to FIG. 2B, shown is a timing diagram 176 in which the feedback signal FB falls below the threshold P1 target. In such case, the outputs R0 and R1 of the comparators 153 and 156 (FIG. 1) remain at a steady state and the values D0 (inverted) and D1 are acquired at the respective transitions of the clock signal Ck.

Figure 2C:
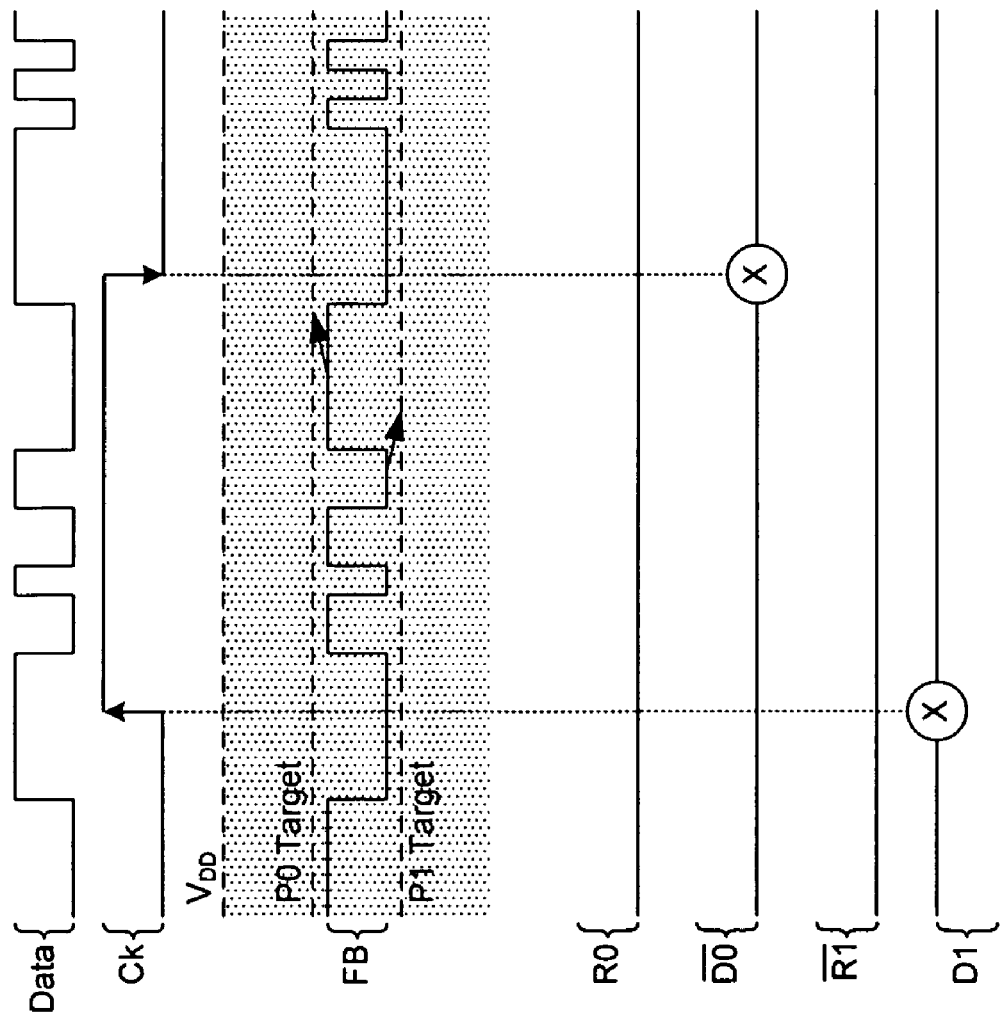

Referring next to FIG. 2C, shown is a timing diagram 179 in which the feedback signal FB falls between the thresholds P0 target and P1 target. As a consequence, there is no toggling of the outputs R0 and R1 of the comparators 153 and 156. Consequently, the outputs D0 (inverted) and D1 of the flip-flops 146 and 149 (FIG. 1) are acquired by the counters 139 and 143 upon the respective upward and downward transitions of the clock signal Ck.

Figure 2D:
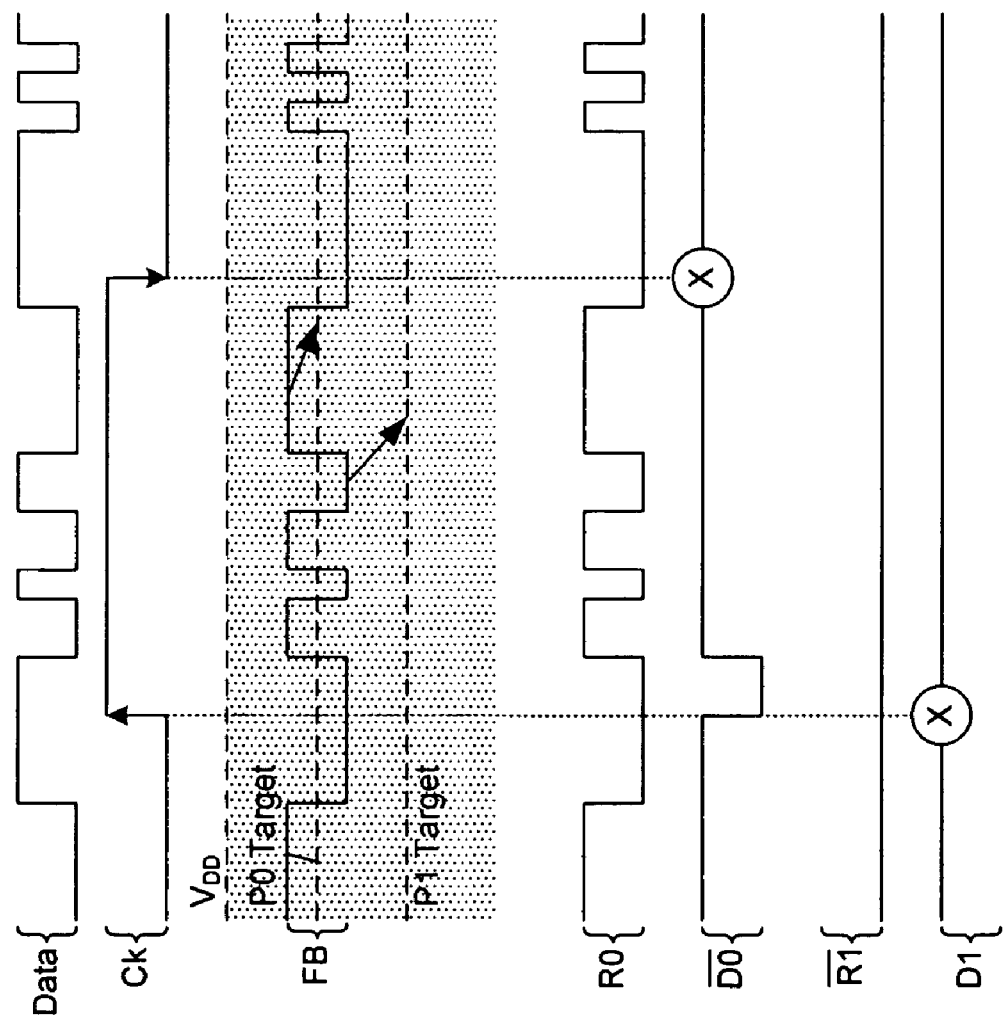

Turning to FIG. 2D, shown is a timing diagram 183 in which the feedback signal FB toggles across the threshold value P0 target. Due to the toggling of the feedback signal FB relative to this threshold, the output R0 of the comparator 153 (FIG. 1) toggles in the same manner. Due to the toggling of the output R0, an upward transition in the clock signal Ck causes a transition in the output of the D flip-flop 146. Due to the fact that the time period between the upward and downward transitions in the clock signal Ck is greater than a maximum number of consecutive digits of equal value in the data signal, the D flip-flop 146 is reset at least once before the acquisition of the data value represented by the output D0 of the D flip flop 146 (inverted) by the P0 counter 139. Once acquired, the digital value stored in the counter 139 is adjusted accordingly.

Figure 2E:
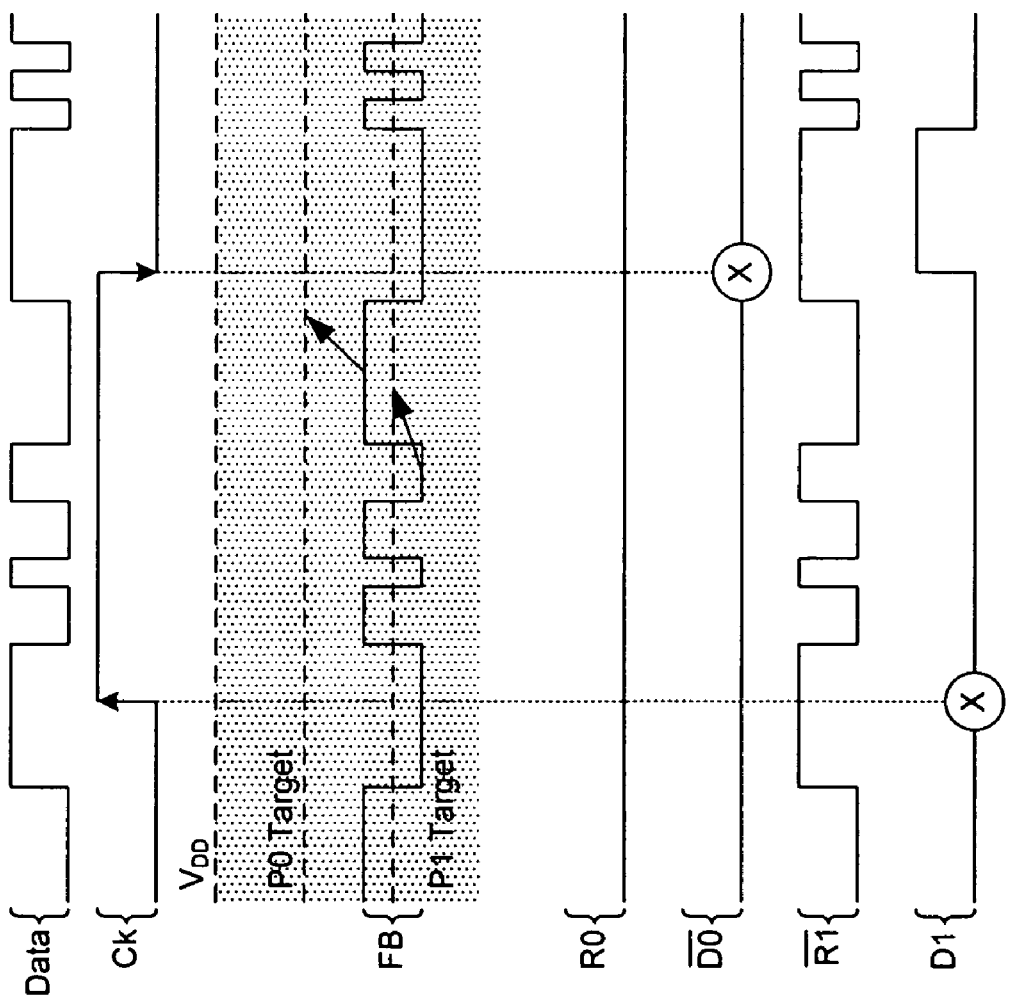

With reference then to FIG. 2E, shown is a timing diagram 186 in which the feedback signal FB toggles above and below the threshold P1 target. Consequently, the output R1 of the comparator 156 (FIG. 1) toggles with the data as shown. Due to the existence of the time period between the upward and downward transitions of the clock signal Ck as described above, the value D1 is reset to a logical "0" in spite of the fact that the output R1 toggles with the data itself before the value of D1 is acquired upon the upward transition of the clock signal Ck.

Figure 2F:
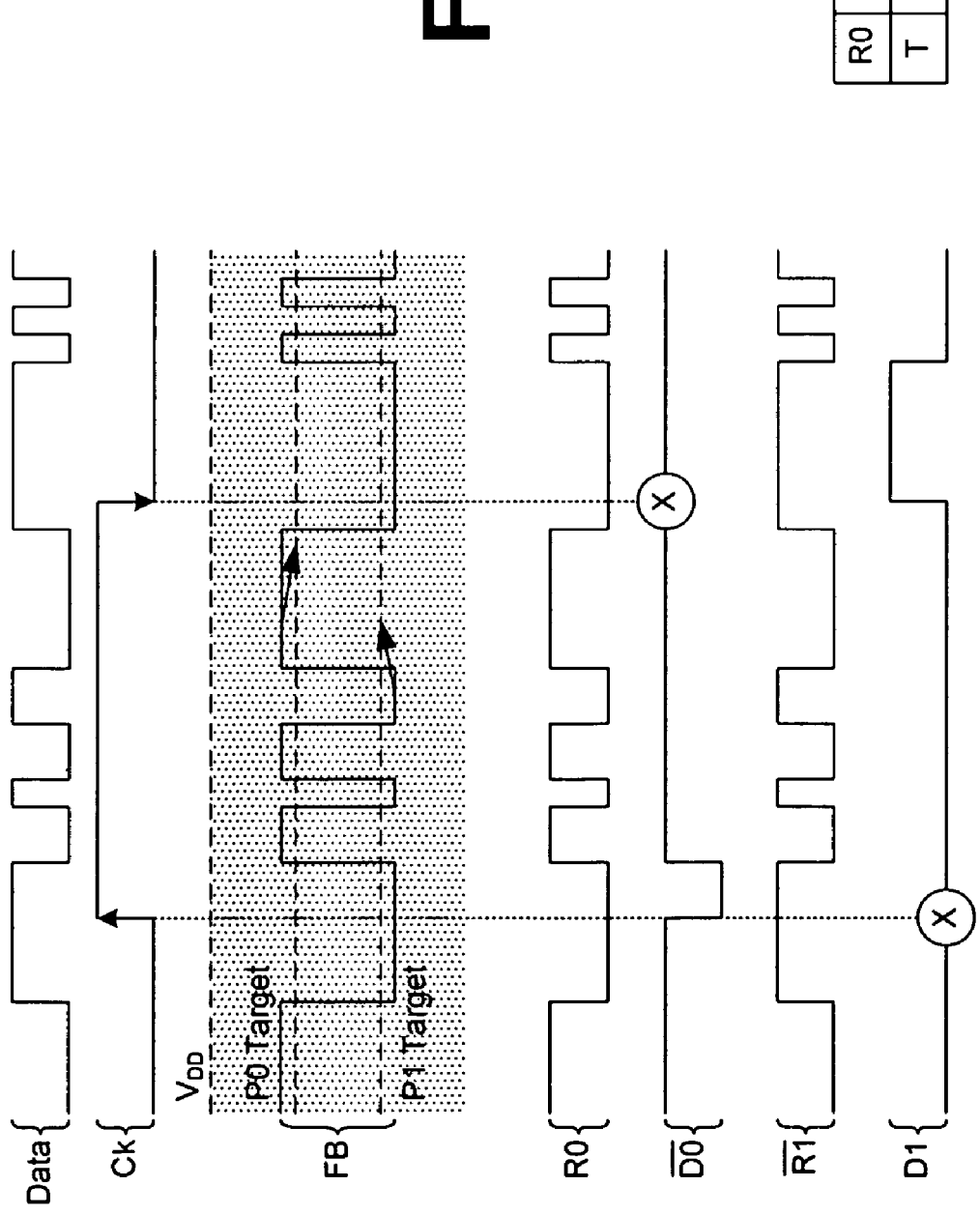

Turning next to FIG. 2F, shown is a timing diagram 189 in which the feedback signal FB straddles both the P0 target and P1 target thresholds. As a result, both of the outputs R0 and R1 of the comparators 153 and 156 toggle with the data. Also, the outputs D0 (inverted) and D1 experience a transition upon an occurrence of the respective downward or upward transitions of the clock signal Ck. Due to the existence of the time period between the upward and downward transitions of the clock signal Ck as described above, the D flip-flops 146 and 149 are reset at least once before the outputs D0 (inverted) and D1 are acquired. These resets ultimately result in the acquisition of the steady state values for the outputs D0 (inverted) and D1 of the D flip-flops 146 and 149 without any adverse effect by the toggling of the comparator outputs RO and R1 (inverted).

As can be seen with reference to the timing diagrams of FIGS. 2A though 2F, the laser driver circuit 100a accurately controls the extinction ratio as long as the bandwidth and response time of both the laser 103 and photodiode 113 and the buffer/amplifier 166 is high enough so as not to attenuate the feedback signal FB. In case the feedback signal FB gets attenuated due to a bandwidth limitation of the photodiode 113 and the buffer amplifier 166, the laser driver circuit 100a will compensate by increasing the modulation current $I_{MOD}$ and decreasing the bias current $I_{BIAS}$, resulting in an increased extinction ratio. Whenever the bandwidth associated with the photodiode 113 and the buffer/amplifier 166 is too slow as compared to the effective data rate of the transmitted signal, then the extinction ratio may degrade and the clock signal Ck would have to be generated in a different manner to avoid unwanted adjustment of the bias current $I_{BIAS}$ and the modulation current $I_{MOD}$ as will be described below.

Figure 3:
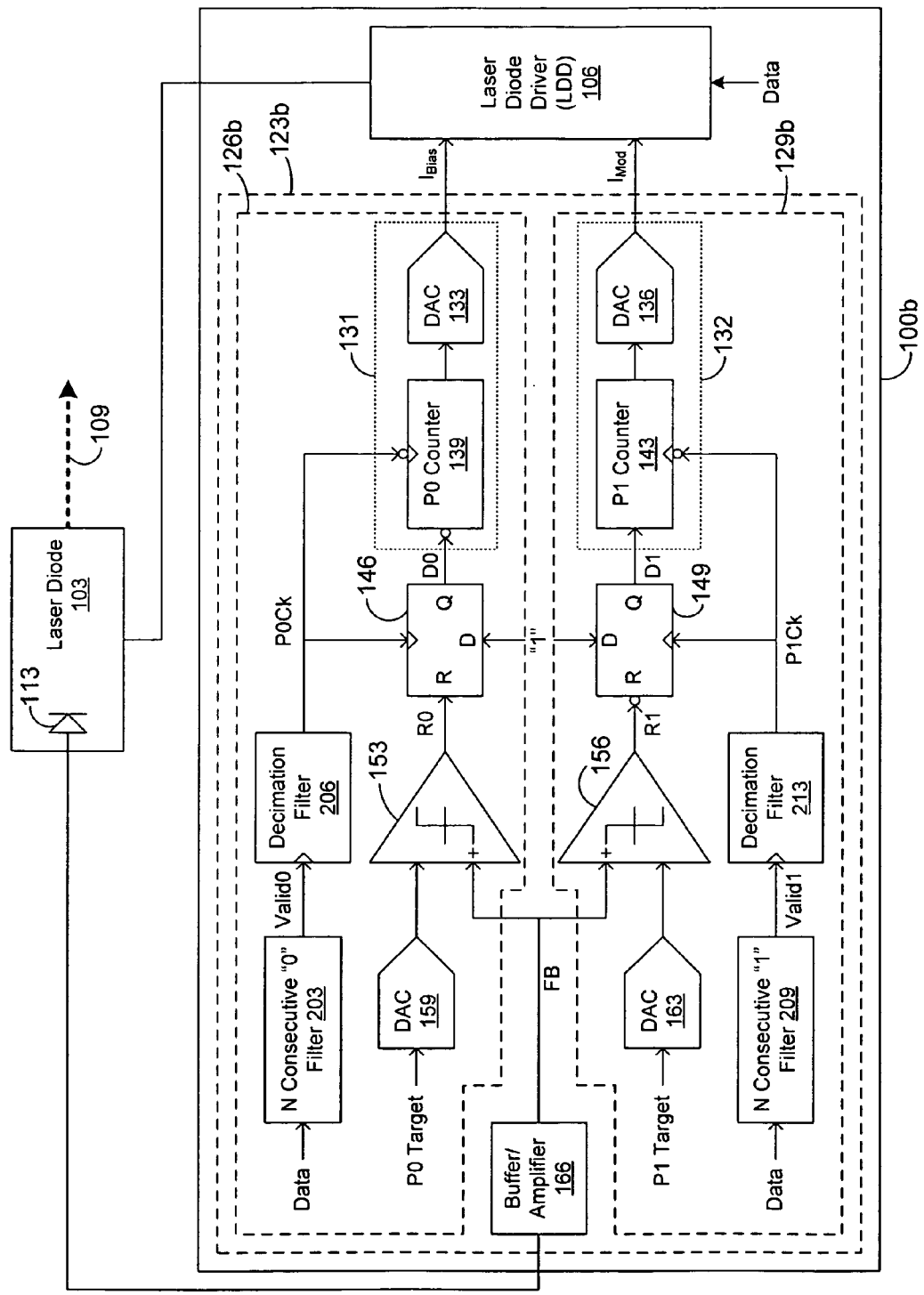
FIG. 3 is a schematic that provides another example of a laser power control circuit according to an embodiment of the present invention.

With this in mind, reference is made to FIG. 3, in which a schematic of a laser driver circuit 100b is shown that is coupled to a laser diode 103 according to another embodiment of the present invention. The laser driver circuit 100b is similar to the laser driver circuit 100a in which several of the components from the laser driver circuit 100a are the same as those shown as part of the laser driver circuit 100b. Where the same components in the laser driver circuit 100a are used in the laser driver circuit 100b, the same reference numbers are employed.

The dual-loop power control circuit 123b generates the bias current $I_{BIAS}$ and modulation current $I_{MOD}$ that are applied to the laser diode driver 106 that generates the ultimate current that is applied to the laser diode 103. In order to generate the bias current $I_{BIAS}$ and modulation current $I_{MOD}$, the dual loop power control circuit 123b includes two power control loop circuits 126b and 129b. The power control loop circuit 126b includes a digital-to-analog converter 133 that is coupled to the laser diode driver 106. Similarly, the power loop control circuit 129b includes a digital-to-analog converter 136 that is coupled to the laser diode driver 106. Also, the power control loop circuit 126b includes a P0 counter 139 and the power control loop circuit 129b includes P1 counter 143. The outputs of the P0 and P1 counters 139 and 143 are applied to the respective digital-to-analog converters 133 and 136. The power control loop circuits 126b and 129b also include D flip-flops 146 and 149.

The D flip-flop 146 of the power control loop circuit 126b generates a signal output D0 that is applied to an inverting input of the P0 counter 139. In a similar manner, an output signal D1 is generated by the D flip-flop 149 of the power control loop circuit 129b is applied to an input of the P1 counter 143 as shown. Both of the D flip-flops 146 and 149 include an input D into which a logical "1" is applied. In this respect, a voltage is applied to the inputs D of the D flip-flops 146 and 149 that represents a logical "1" as can be appreciated.

Each of the power control loop circuits 126b and 129b includes a comparator 153 and 156, respectively. The comparator 153 generates signal output R0 that is applied to a reset input R of the D flip-flop 146. Similarly, the comparator 156 generates a signal output R1 that is inverted and applied to the reset input of the D flip-flop 149. The comparators 153 and 156 are analog devices that compare two analog input currents and generate the signal outputs R0 or R1, respectively. Specifically, the signal outputs R0 and R1 are digital outputs that are generated based upon the comparison made between two analog inputs to the respective comparators 153 or 156. The signal outputs R0 or R1 comprise voltages that represent a logical "0" or a logical "1" depending upon the results of the comparison.

The power loop control circuit 126b includes a digital-to-analog converter 159 that generates an analog current that is applied as an input to the comparator 153. The current generated by the digital-to-analog converter 159 is proportional to the P0 target threshold. This value establishes a digital threshold that is proportional to the monitor photodetector current corresponding to a desired bias current $I_{BIAS}$ that is to be applied to the laser diode driver 106 to generate a corresponding minimum current applied to the laser diode 103. This minimum current in turn causes the laser diode 103 to generate the desired laser radiation 109 corresponding to a logical "0". In another embodiment, the digital-to-analog converter 159 may not be necessary where the P0 target is expressed in a form that is the same as the feedback signal FB and/or directly compatible with the comparator 153.

The power control loop circuit 129b also includes a digital-to-analog converter 163 that generates an analog current output that is applied as an input to the comparator 156. In this respect, the digital-to-analog converter 163 receives a digital input that comprises a digital threshold that is proportional to the monitor photodetector current corresponding to a desired modulation current $I_{MOD}$ that is employed to generate the maximum current applied to the laser diode 103 in generating the laser radiation 109. The digital threshold applied to the digital-to-analog converter 163 is the P1 target threshold. In another embodiment, the digital-to-analog converter 156 may not be necessary where the P1 target is expressed in a form that is the same as the feedback signal FB and/or directly compatible with the comparator 156.

Each of the comparators 153 and 156 also receive a feedback input from the laser photodiode 113. In particular, the signal generated by the laser photodiode 113 is applied to a buffer/amplifier 166. The output of the buffer/amplifier 166 is applied to respective inputs of the comparators 153 and 156. The outputs of R0 and R1 of the comparators 153 and 156 are equal to a logical "1" when the feedback signal applied to the comparators 153 is greater than the respective analog signals generated by the digital-to-analog converters 156 and 159 based upon the P0 target and P1 target inputs.

The power control loop circuit 126b also includes a filter 203 and a decimation filter 206. The filter 203 comprises an "N consecutive 0" filter that generates an output upon an occurrence of N-consecutive logical "0's" in the data signal received as an input to the filter 203. The data signal received as the input to the filter 203 is the same data signal input into the laser diode driver 106. Upon each occurrence of N-consecutive "0's", the filter 203 generates a pulse output that is applied to the decimation filter 206. The pulse output of the filter 203 comprises a signal denoted herein as "Valid0" which refers to the fact that a valid number of consecutive "0's" has occurred.

The decimation filter 206 generates a clock output P0Ck that is applied to a clock input of the D flip-flop 146. Also, the clock P0Ck is inverted and applied to a clock input of the P0 counter 139. The decimation filter 206 generates the clock signal P0Ck that undergoes a positive or negative transition upon an occurrence of a predefined number of the pulses generated by the filter 203. In one embodiment, the clock signal P0Ck undergoes a positive or negative transition at least upon every third or more pulses generated by the filter 203. Thus, according to this embodiment, the decimation filter 206 has a pulse reduction ratio of three or more to 1. This ensures that a capture of data by the counter 139 is valid as will be described.

The power control loop circuit 129b also includes a filter 209 and a decimation filter 213. The filter 209 receives the data signal as an input and generates a "Valid1" signal that is applied to an input of the decimation filter 213. In response thereto, the decimation filter 213 generates a clock signal P1Ck is applied to clock input of the D flip-flop 149. Also, the clock signal P1Ck is inverted and applied to the clock input of the P1 counter 143.

The filter 209 is similar to the filter 203, except the filter 209 generates an output pulse upon an occurrence of N consecutive logical "1's" in the data. The decimation filter 213 is similar to the decimation filter 206 in which it generates the clock signal P1Ck that transitions upon an occurrence of a predefined number of the pulses in the Valid1 signal generated by the filter 209. In one embodiment, the decimation filter 213 generates a positive or negative transition in the clock signal P1Ck after at least three pulses generated by the filter 209 to ensure that valid data is acquired by the counter 143 as will be described.

Next, the general operation of the laser driver circuit 100b is described. In particular, the operation of the power control loop circuits 126b and 129b is described in generating the bias current $I_{BIAS}$ and the modulation current $I_{MOD}$. To begin, each of the counters 139 and 143 holds a digital value. It is this digital value that is applied as an output to the digital-to-analog converters 133 and 136 that, in turn, generate the bias current $I_{BIAS}$ and the modulation current $I_{MOD}$ that are applied to the laser diode driver 106. The digital values held by the counters 139 and 143 may be incremented or decremented depending upon the inputs received from the respective D flip-flops 146 and 149. Specifically, if the a logical "0" is seen at the input of a given one of the counters 139 or 143 at the occurrence of a negative transition of a respective clock signal P0Ck or P1Ck, then the digital value stored therein is decremented. Similarly, if the a logical "1" is seen at the input of a given one of the counters 139 or 143 at the occurrence of a negative transition of a respective clock signal P0Ck or P1Ck, then the digital value stored therein is incremented. Alternatively, analog circuitry may be employed in place of the counters 139/143 and the digital-to-analog converters 133/136 as described above with reference to the laser driver circuit 100a.

Thus, in the present example, the bias current $I_{BIAS}$ and modulation current $I_{MOD}$ applied to the laser diode driver 106 will vary based upon variation in the respective digital values held in the counters 139 and 143. Depending upon the resolution of the counters 139 and 143, which may correspondingly depend upon the number of binary digits applied to the digital-to-analog converters 133 and 136, a single increment or decrement of the digital values in the counters 139 and 143 will cause a corresponding greater or lesser change in the bias current $I_{BIAS}$ or modulation current $I_{MOD}$.

The laser diode driver 106 generates a laser driver signal that embodies the data received as an input. The laser driver signal is a digital signal that is generated based upon the bias current $I_{BIAS}$ and the modulation current $I_{MOD}$. Each of the power control loop circuits 126b and 129b cause the digital values in the counters 139 and 143 to be adjusted based upon the comparison between the respective target threshold currents generated based on the digital values of P0 target or P1 target and the feedback current generated from the laser photodiode 113 of the laser diode 103.

The digital values held in the counters 139 and 143 are adjusted based upon the outputs P0 and P1 of the D flip-flops 146 and 149. In this respect, the clock signals P0Ck and P1Ck that are generated ultimately based upon occurrences of the multiple consecutive digits of equal value, whether they be logical "0's" or logical "1's" in the data signal, trigger the adjustment of the digital values in the counters 139 and 143. Also, the clock signals P0Ck and P1Ck are generated based upon the decimation of the signal output of the filters 203 and 209 as described above and as is illustrated in the timing diagrams to follow.

According to one embodiment of the present invention, the decimation filters 206 and 213 that are employed to generate the clock signals P0Ck and P1Ck cause the clock signals P0Ck and P1Ck to have a pulse width that is greater than a delay that may occur between the feedback signal received from the laser photodiode 113 and the data signal that is input to the laser diode driver 106 and the filters 203 and 209. This relationship ensures that the outputs of the D flip-flops D0 and D1 that cause the adjustment of the digital values held in the counters 139 and 143 are reliable values generated based upon the action of the comparators 153 and 156 that are not affected by the feedback signal straddling one or more of the target power levels P0 target and P1 target as will be described with reference to the timing diagrams to follow.

Ultimately, in the power control loop circuit 126b, for example, when the feedback signal from the laser photodiode 113 is greater than P0 target, then the output R0 of the comparator 153 will comprise a logical "1". As a consequence, the D flip-flop 146 is reset and the output D0 is equal to a logical "0". Given that the output of the D flip-flop 146 is inverted as it is applied as an input to the P0 counter 139, then a logical "1" is applied to the P0 counter 139 and the digital value stored therein is incremented upon a downward transition in the clock signal P0Ck. The power control loop circuit 129b operates in a similar manner with the exception that the signal output R1 is inverted as it is applied to the D flip-flop 149, and the output D1 of the D flip-flop is not inverted as it is applied as an input to the P1 counter 143.

In addition, while the laser driver circuit 100b is also described above in the voltage domain, it is understood that the same circuit may be implemented in the current domain. In this respect, the feedback may comprise a current that is applied to a current mirror, for example, to generate two feedback currents that are applied to each of the comparators 153 and 156 as can be appreciated.

Figure 4A:
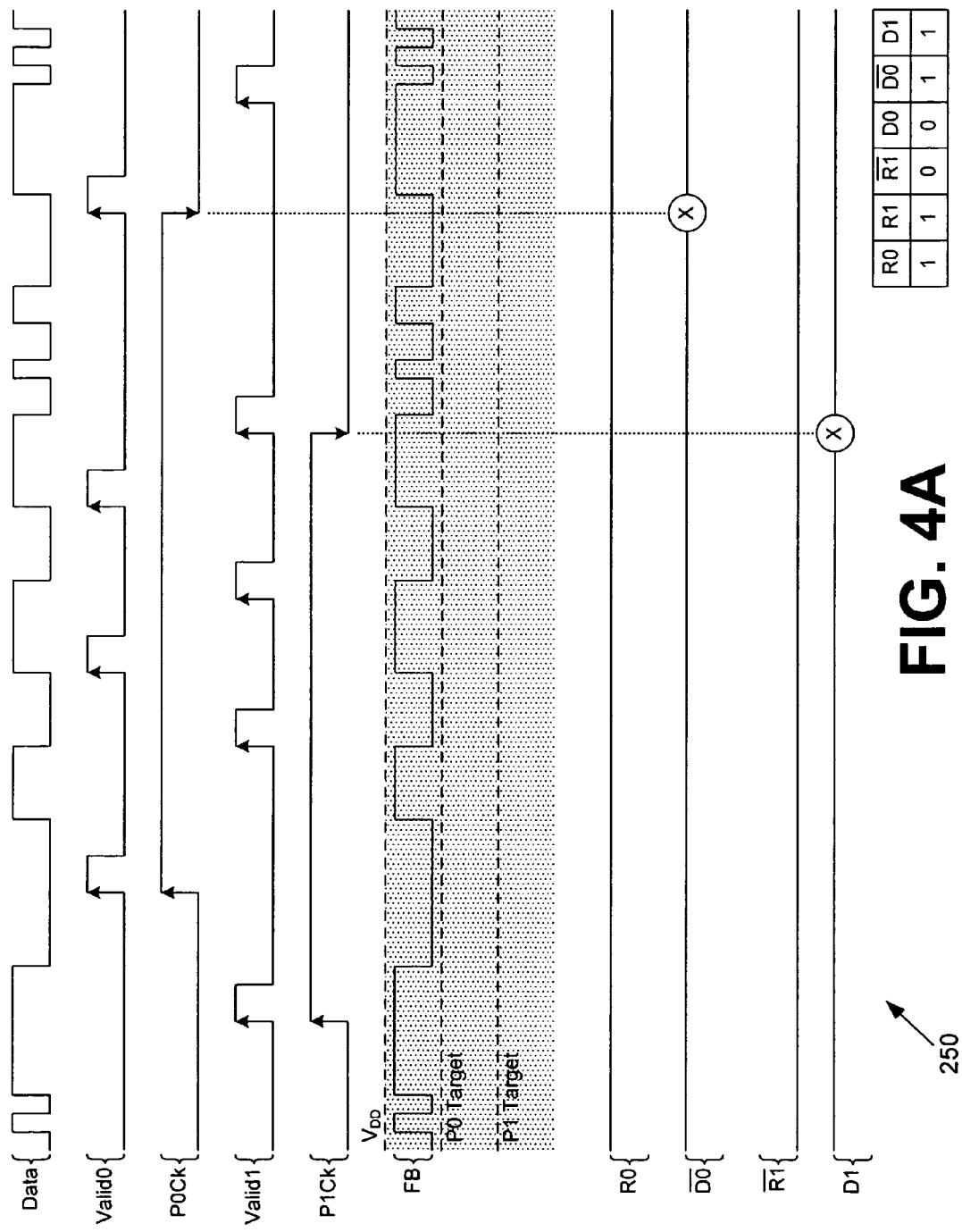
FIGS. 4A-4F are timing diagrams that provide examples of various scenarios of operation of the laser power control circuit of FIG. 3 according to various embodiments of the present invention.

Referring next to FIG. 4A, shown is a timing diagram 250 that illustrates the operation of the dual-loop power control circuit 123b according to an embodiment of the present invention. As shown, the feedback signal (FB) generated by the laser photodiode diode 113 (FIG. 3) is the same as the data signal at the top of the timing diagram. It may be the case that the feedback signal FB is delayed with respect to the data signal by predefined period of time. The feedback signal FB in the timing diagram 250 is greater than both the target thresholds P0 target and P1 target, but is less than a maximum power voltage $V_{DD}$. According to one embodiment, it is desirable that the feedback signal FB fall between P1 target and P0 target such that the upper and lower extremities of the feedback signal FB were approximately equal to P0 target and P1 target. In other embodiments, it may be desirable that the feedback signal FB operate with magnitudes relating to other thresholds as can be appreciated.

As shown in the timing diagram 250, the bias current $I_{BIAS}$ (FIG. 3) and modulation current $I_{MOD}$ (FIG. 3) need to be adjusted so that the feedback signal FB falls in the appropriate position and operates with a desired extinction ratio which refers to the difference between the maximum laser output and the minimum laser output—which may be zero laser output. The valid signals Valid0 and Valid1 generated by the filters 203 and 209 (FIG. 3) comprise pulses that are generated upon an occurrence of a predefined number of consecutive logical "0's" or logical "1's" in the data signal. The decimation filters 206 and 213 generate the clock signals P0Ck and P1Ck which, according to one embodiment, experience a positive or negative transition upon every fourth pulse experienced in the valid signals Valid0 and Valid1. Thus, the decimation filters 206 and 213 operate at a factor of four. However, it is possible that some other factor may be employed. In one embodiment, the factor employed in the decimation filters 206 and 213 is greater than two for best results.

The downward transitions of the clock signals P0Ck and P1Ck cause the acquisition of the outputs of the D flip-flops 146 and 149, which comprise the inverted output D0 and the output D1, into the counters 139 and 143. As shown, the inverted output D0 is a logical "1" and the output D1 is also a logical "1". The states of the outputs R0 and R1 of the comparators 153 and 156 (FIG. 3) as well as the outputs D0 and D1 of the flip-flops 146 (FIG. 3) and 149 (FIG. 3) are shown in the truth table that is shown in the lower right hand corner of the timing diagram 250. In this respect, the truth table coincides with the scenario described in the timing diagram 250. For the sake of convenience, each timing diagram described herein also includes a corresponding truth table in the lower right hand corner.

Figure 4B:
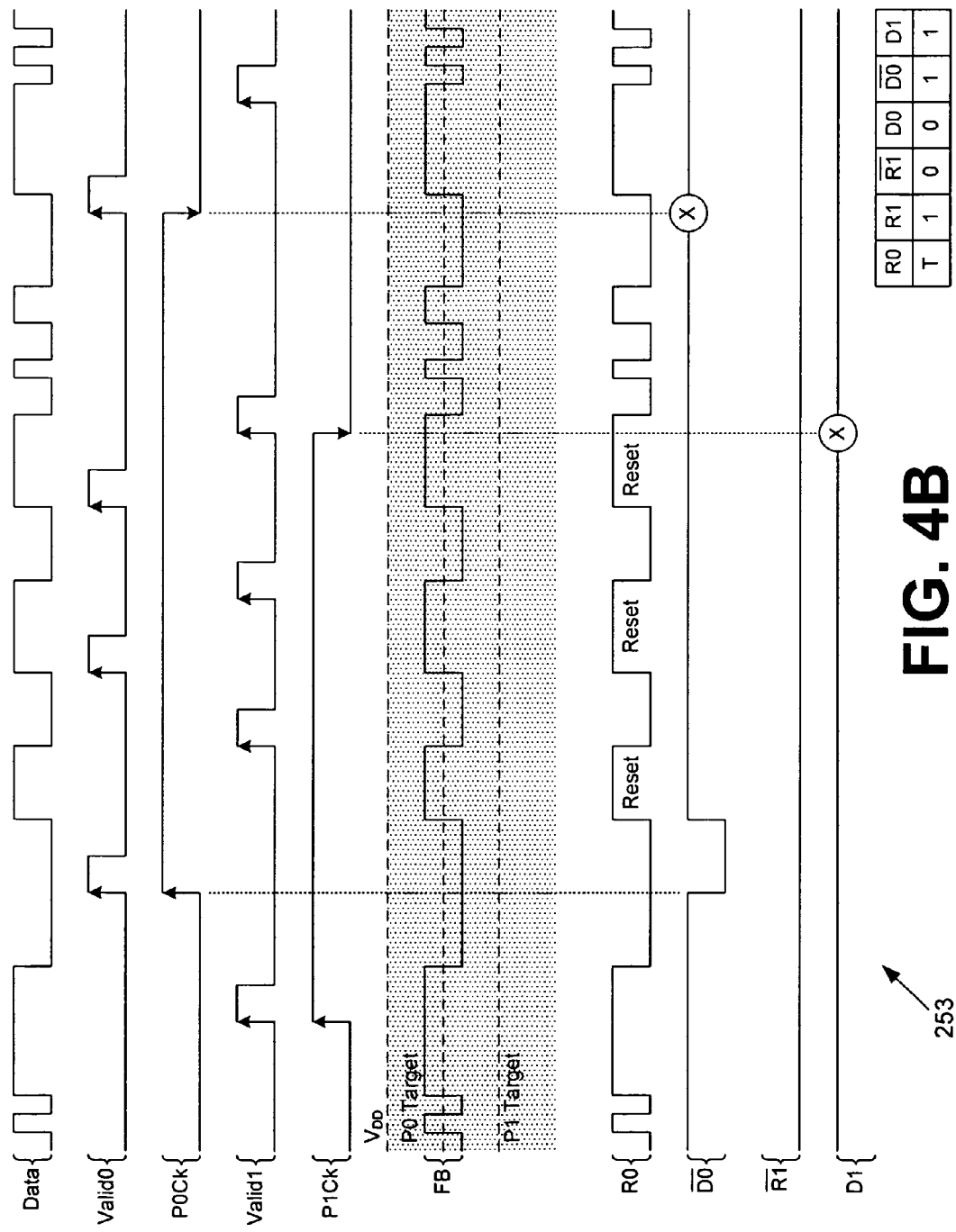

With reference to FIG. 4B, shown is a second timing diagram 253 in which the feedback signal FB toggles across the threshold value P0 target. Due to the toggling of the feedback signal FB relative to this threshold, the output R0 of the comparator 153 (FIG. 3) toggles in the same manner. Due to the toggling of the output R0, an upward transition in the clock signal P0Ck causes a transition in the output of the D flip-flop 146. Due to the fact that the decimation filter 206 ensures that the clock signal P0Ck is extended over the course of several pulses of the valid signal Valid0, then the D flip-flop 146 is reset multiple times before the acquisition of the data value represented by the output D0 of the D flip flop 146 (inverted) by the P0 counter 139. Once acquired, the digital value stored in the counter 139 is incremented maintained therein is adjusted accordingly.

Figure 4C:
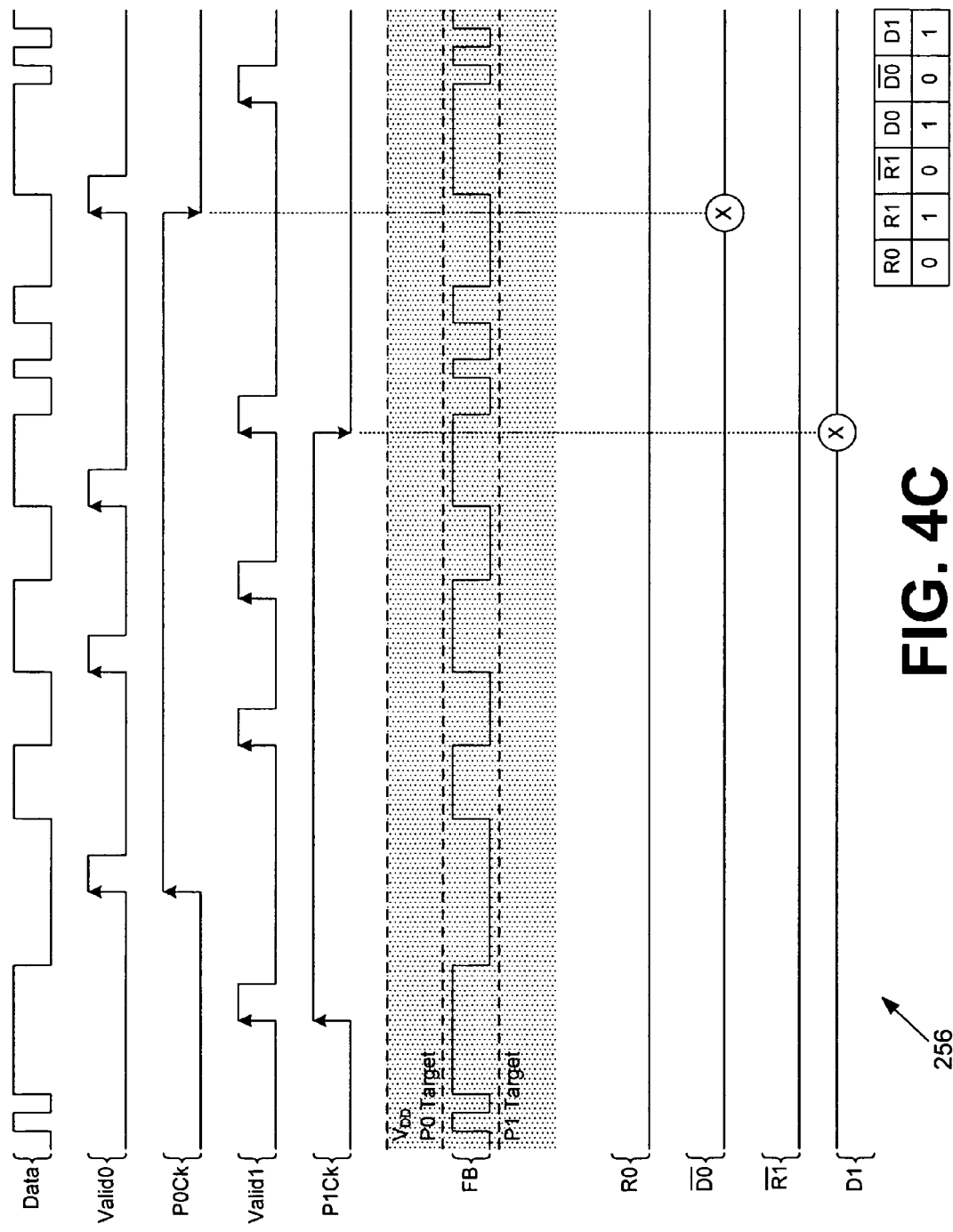

Turning then to FIG. 4C, shown is a timing diagram 256 in which the feedback signal FB falls between the thresholds P0 target and P1 target. As a consequence, there is no toggling of the outputs R0 and R1 of the comparators 153 and 156, and the outputs D0 (inverted) and D1 of the flip-flops 146 and 149 (FIG. 3) are acquired by the counters 139 and 143 upon a downward transition and the clocks P0Ck and P1Ck.

Figure 4D:
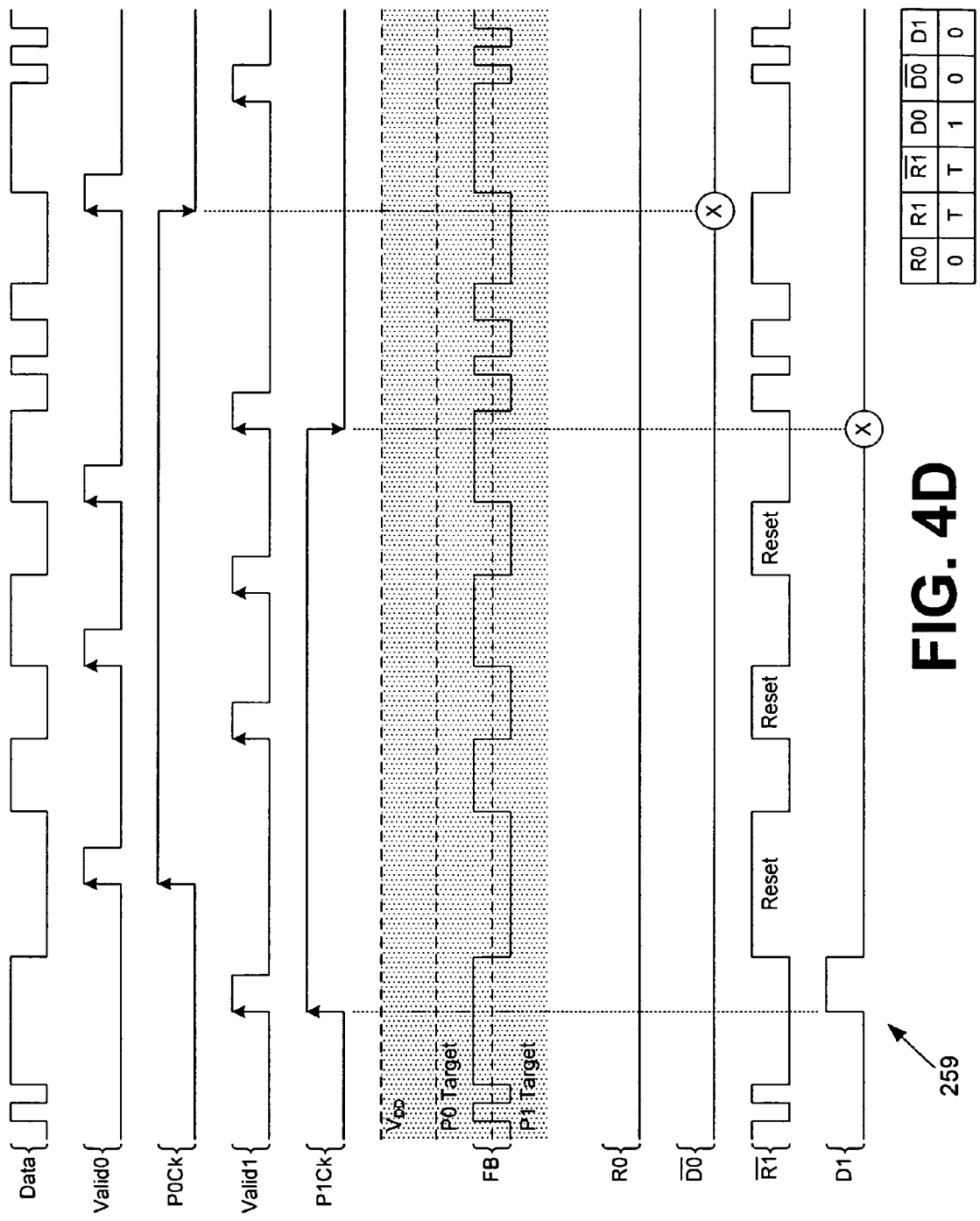

With reference next to FIG. 4D, shown is a timing diagram 259 in which the feedback signal FB toggles above and below the threshold P1 target. Consequently, the output R1 of the comparator 156 (FIG. 3) toggles with the data as shown. Due to the operation of the decimation filter 213, there is a significant period of time between the upward and downward transitions of the clock signal P1Ck that allow a number of resets to be applied to the D flip-flop 149 (FIG. 3) to reset the value D1 to a logical "0" in spite of the fact that the output R1 toggles with the data itself before the value of D1 is acquired upon the downward transition of the clock signal P1Ck.

Figure 4E:
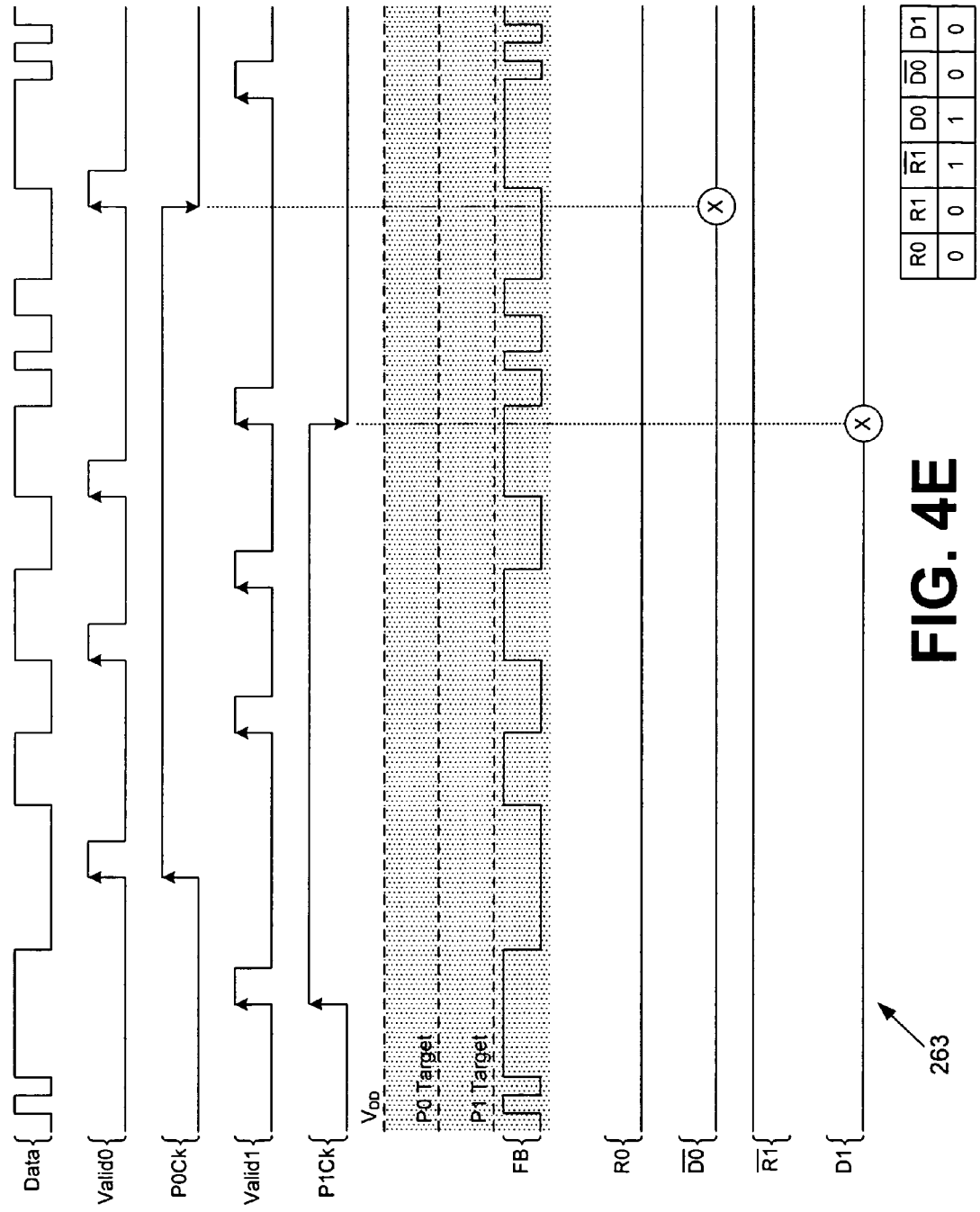

With reference then to FIG. 4E, shown is a timing diagram 263 in which the feedback signal FB falls below the threshold P1 target. In such case, the outputs R0 and R1 of the comparators 153 and 156 (FIG. 3) remain at a steady state and the values D0 (inverted) and D1 are acquired at the downward transitions of the clocks P0Ck and P1Ck.

Figure 4F:
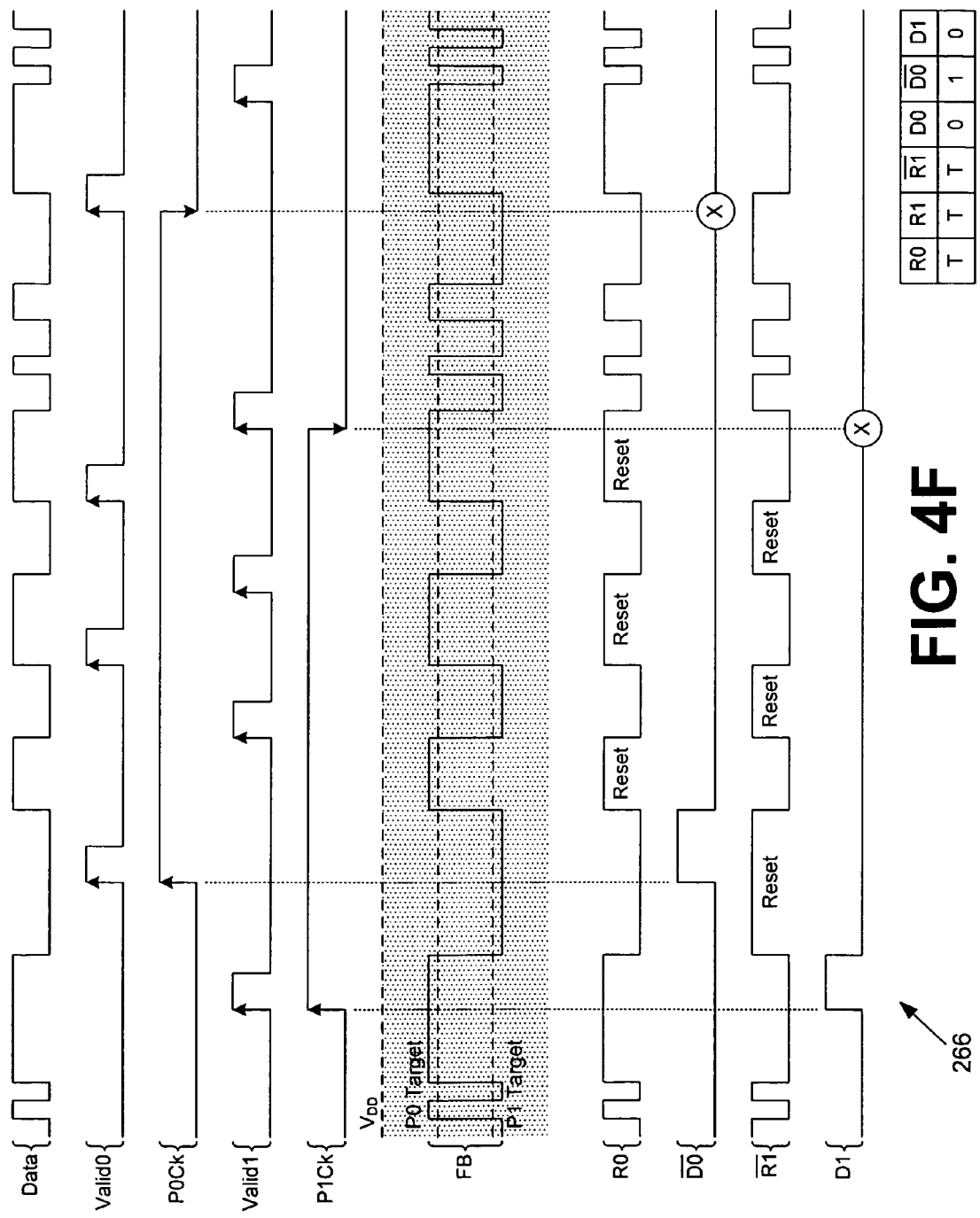

With reference next to FIG. 4F, shown is a timing diagram 266 in which the feedback signal FB straddles both the thresholds P0 target and P1 target. As a result, both of the outputs R0 and R1 of the comparators 153 and 156 toggle with the data. Also, the outputs D0 (inverted) and D1 experience a transition upon an occurrence of the upward transition of the clock signals P0Ck and P1Ck. Due to the fact that the decimation filters 206 and 213 have extended the time between the positive and negative transitions of the clock signals P0Ck and P1Ck, multiple resets are applied to the D flip-flops 146 and 149 between the time that a positive transition occurs in each of the clocks P0Ck and P1Ck and the negative transitions of the clocks P0Ck and P1Ck. These resets ultimately result in the acquisition of the steady state values for the outputs D0 (inverted) and D1 of the D flip-flops 146 and 149 without any adverse effect by the toggling of the comparator outputs R0 and R1 (inverted).

Although the invention is shown and described with respect to certain embodiments, it is obvious that equivalents and modifications will occur to others skilled in the art upon the reading and understanding of the specification. The present invention includes all such equivalents and modifications, and is limited only by the scope of the claims.

What is claimed is:

1. A laser power control system, comprising:
a first circuit that generates an analog current, wherein a data threshold current is generated by a laser driver based upon at least the analog current, the data threshold current being employed to generate a data value in a data signal employed to drive a laser diode;
a second circuit that employs a clocked component that generates a binary output, the binary output being generated depending upon a comparison between a target threshold current and a feedback current generated from a laser output of the laser diode;
the first circuit being configured to adjust a magnitude of the analog current based upon the binary output, where adjustment of the analog current causes adjustment of the data threshold current while the data threshold current is employed to generate the data value in the data signal; and
wherein the adjustment of the magnitude of the analog current based upon the binary output occurs upon a predefined transition in a clock signal, the clock signal generated based upon occurrences of multiple consecutive digits of equal value in the data signal, and a time duration of a 50% duty cycle of the clock signal is greater than a time duration of a maximum number of multiple consecutive digits of equal value that is allowed to be transmitted by the laser diode.

2. The laser power control system of claim 1, wherein the clocked component further comprises a D flip-flop.

3. The laser power control system of claim 1, wherein the analog current is a bias current and the data threshold current comprises a minimum current applied to the laser diode.

4. The laser power control system of claim 1, wherein the analog current is a modulation current and the data threshold current comprises a maximum current applied to the laser diode.

5. The laser power control system of claim 1, wherein the first circuit further comprises:
a counter that holds a digital value; and
a digital-to-analog converter that converts the digital value into the analog current.

6. The laser power control system of claim 2, wherein the clock signal applied to a clock input of the D flip-flop.

7. The laser power control system of claim 2, further comprising a comparator that performs the comparison between the target threshold current and the feedback current, wherein an output of the comparator is applied to a reset input of the D flip-flop.

8. The laser power control system of claim 2, further comprising a comparator that performs the comparison between the target threshold current and the feedback current, wherein an output of the comparator is applied to an inverting reset input of the D flip-flop.

9. A laser power control system, comprising:
a first circuit that generates an analog current, wherein a data threshold current is generated by a laser driver based upon at least the analog current, the data threshold current being employed to generate a data value in a data signal employed to drive a laser diode;
a second circuit that employs a clocked component that generates a binary output, the binary output being generated depending upon a comparison between a target threshold current and a feedback current generated from a laser output of the laser diode;
the first circuit being configured to adjust a magnitude of the analog current based upon the binary output, where adjustment of the analog current causes adjustment of the data threshold current while the data threshold current is employed to generate the data value in the data signal;
wherein the adjustment of the magnitude of the analog current based upon the binary output occurs upon a predefined transition in a clock signal, the clock signal generated based upon occurrences of multiple consecutive digits of equal value in the data signal, and the clock signal has a pulse width that is greater than a delay between a feedback signal generated by the feedback current and the data signal due to the decimation of the filtered data signal; and
wherein a filtered data signal is generated based upon each of the occurrences of multiple consecutive digits of equal value in the data signal, and the clock signal is generated based upon a decimation of the filtered data signal.

10. A method for laser power control, comprising the steps of:
generating an analog current;
generating a data threshold current using a laser driver based upon at least the analog current;
driving a laser diode according to a data signal that embodies the data threshold current to represent a data value;
generating a first binary output based upon a comparison between a target threshold current and a feedback current generated from a laser output of the laser diode;
generating a second binary output using a D flip-flop based upon the first binary output;
adjusting a magnitude of the analog current based upon the second binary output, where adjustment of the analog current causes adjustment of the data threshold current while the data threshold current is employed to generate the data value in the data signal; and
wherein the adjustment of the magnitude of the analog current based upon the binary output occurs upon a predefined transition in a clock signal, the clock signal generated based upon occurrences of multiple consecutive digits of equal value in the data signal, and a time duration of a 50% duty cycle of the clock signal is greater than a time duration of a maximum number of multiple consecutive digits of equal value that is allowed to be transmitted by the laser diode.

11. The method of claim 10, wherein the step of generating the data threshold current further comprises generating a minimum current applied to the laser diode, the minimum current representing a logical "0", wherein the analog current comprises a bias current.

12. The method of claim 10, wherein the step of generating the data threshold current further comprises generating a maximum current applied to the laser diode, the maximum current representing a logical "1", wherein the analog current comprises a modulation current.

13. The method of claim 10, wherein the step of generating the analog current further comprises the steps of:
maintaining a digital value in a counter; and
converting the digital value into the analog current using a digital-to-analog converter.

14. The method of claim 10, further comprising the steps of:
applying the first binary output to a reset input of the D flip-flop; and
resetting the D flip-flop upon an occurrence of a predefined transition in the clock signal.

15. The method of claim 10, further comprising the steps of applying a clock signal to a clock input of the D flip-flop, wherein the adjustment of the magnitude of the analog current based upon the binary output occurs upon a predefined transition in the clock signal.

16. A laser power control system, comprising:

means for generating an analog current, wherein a data threshold current is generated by a laser driver based upon at least the analog current, the data threshold current being employed to generate a data value in a data signal employed to drive a laser diode;

means for generating a binary output based upon a comparison between a target threshold current and a feedback current generated from a laser output of the laser diode, wherein a magnitude of the analog current is adjusted based upon the binary output;

means for triggering the adjustment of the magnitude of the analog current based on the binary output, where adjustment of the analog current causes adjustment of the data threshold current while the data threshold current is employed to generate the data value in the data signal; and wherein the adjustment of the magnitude of the analog current based upon the binary output occurs upon a predefined transition in a clock signal, the clock signal generated based upon occurrences of multiple consecutive digits of equal value in the data signal, and a time duration of a 50% duty cycle of the clock signal is greater than a time duration of a maximum number of multiple consecutive digits of equal value that is allowed to be transmitted by the laser diode.

17. The laser power control system of claim 16, wherein the means for generating the binary output further comprises a D flip-flop.

18. The laser power control system of claim 17, wherein the means for generating the binary output further comprises a comparator that performs the comparison between the target threshold current and the feedback current, the comparator generating an output that is applied to the D flip-flop.

* * * * *